(12) United States Patent
Ootsuka et al.

(10) Patent No.: US 7,042,051 B2
(45) Date of Patent: May 9, 2006

(54) SEMICONDUCTOR DEVICE INCLUDING IMPURITY LAYER HAVING A PLURALITY OF IMPURITY PEAKS FORMED BENEATH THE CHANNEL REGION

(75) Inventors: Fumio Ootsuka, Tokorozawa (JP); Takahiro Onai, Ome (JP); Kazuhiro Ohnishi, Kodaira (JP); Shoji Wakahara, Yokohama (JP)

(73) Assignee: Renesas Technology Corp., Tokyo (JP)

( * ) Notice: Subject to any disclaimer, the term of this patent is extended or adjusted under 35 U.S.C. 154(b) by 18 days.

(21) Appl. No.: 10/298,597

(22) Filed: Nov. 19, 2002

(65) Prior Publication Data

US 2003/0094627 A1    May 22, 2003

Related U.S. Application Data

(62) Division of application No. 09/965,479, filed on Sep. 28, 2001, now Pat. No. 6,524,903.

(30) Foreign Application Priority Data

Oct. 18, 2000   (JP) .............................. 2000-317345
Jul. 19, 2001   (JP) .............................. 2001-219666

(51) Int. Cl.
H01L 29/78    (2006.01)

(52) U.S. Cl. .................... 257/345; 257/344; 257/402
(58) Field of Classification Search ............... 257/368, 257/371–377, 344, 345, 369, 402, 408, 409
See application file for complete search history.

(56) References Cited

U.S. PATENT DOCUMENTS

| 5,031,008 A | * | 7/1991 | Yoshida ...................... 257/343 |
| 5,719,081 A | | 2/1998 | Racanelli et al. |
| 5,827,763 A | | 10/1998 | Gardner et al. |
| 6,143,635 A | * | 11/2000 | Boyd et al. ................. 438/585 |
| 6,153,454 A | * | 11/2000 | Krivokapic ................. 438/225 |
| 6,342,429 B1 | | 1/2002 | Puchner et al. |
| 6,365,473 B1 | | 4/2002 | Lee |

FOREIGN PATENT DOCUMENTS

JP          04058562         2/1992

* cited by examiner

Primary Examiner—Howard Weiss
Assistant Examiner—Marcos D. Pizarro
(74) Attorney, Agent, or Firm—Antonelli, Terry, Stout and Kraus, LLP.

(57) ABSTRACT

Provided is a manufacturing method of a semiconductor device which comprises forming, all over the surface of a substrate below the channel region of a MISFET, a p type impurity layer having a first peak in impurity concentration distribution and another p type impurity layer having a second peak in impurity concentration distribution, each layer having a function of preventing punch-through. Compared with a device having a punch through stopper layer of a pocket structure, the device of the present invention is suppressed in fluctuations in the threshold voltage. Moreover, with a relative increase in the controllable width of a depletion layer, a sub-threshold swing becomes small, thereby making it possible to prevent lowering of the threshold voltage and to improve a switching rate of the MISFET.

28 Claims, 9 Drawing Sheets

SEMICONDUCTOR DEVICE INCLUDING IMPURITY LAYER HAVING A PLURALITY OF IMPURITY PEAKS FORMED BENEATH THE CHANNEL REGION

CROSS REFERENCE TO RELATED APPLICATION

This application is a Rule 53(b) divisional of U.S. application Ser. No. 09/965,479 filed Sep. 28, 2001, now U.S. Pat. No. 6,524,903, the subject matter of which is incorporated herein by reference.

BACKGROUND OF THE INVENTION

The present invention relates to a manufacturing technique of a semiconductor device, particularly to a technique effective when applied to a semiconductor device having a MISFET (metal insulator semiconductor field effect transistor) of the generation of a gate length not greater than 0.1 μm.

As a MISFET capable of controlling short channel effects, a MISFET having a punch through stopper layer of a pocket structure is described in Japanese Patent Application Laid-Open No. Hei 4(1992)-58562.

This MISFET is fabricated by ion-implanting a second conductivity type impurity to the surface of a substrate with a gate electrode, which has been formed over a first conductivity type substrate through an insulating film, as a mask, thereby forming a first diffusion region; ion-implanting a first conductivity type impurity below this first diffusion region, thereby forming a second diffusion region, that is, a so-called punch-through stopper layer having a pocket structure; forming a conductive side wall film on both sides of the gate electrode; and then ion-implanting a second conductivity type impurity into the surface of the substrate with the side wall film and the gate electrode as a mask, thereby forming a third diffusion region.

The short channel effects occur mainly because an electric field generated from the drain of a MISFET reaches the source, thereby causing an electric current to flow between the source and drain. In the above-described MISFET, however, the electric field intensity generated from the drain is suppressed by the punch-through stopper layer (second diffusion region) having a reversal field type pocket structure, making it possible to avoid generation of short channel effects even if the gate length is 0.2 μm or so.

SUMMARY OF THE INVENTION

As a result of investigation of a MISFET having a punch-through stopper layer of a pocket structure, however, the present inventors found the below-described problems.

Miniaturization of a gate electrode of a MISFET in the width direction of a source or drain (hereinafter called "gate length" simply) is necessary for high integration of a semiconductor device. In a MISFET having a gate length not greater than 0.1 μm, when the punch-through stopper layer of a pocket structure has an extension of 0.03 μm or greater, this extension below the gate electrode accounts for at least 60% of the gate length. Owing to variations in the shape of a gate electrode or in an ion-implantation angle upon formation of a punch-through stopper layer, fluctuations of a threshold voltage of a MISFET therefore occur.

An object of the present invention is therefore to provide a technique capable of suppressing fluctuations in the threshold voltage and improving a switching rate in a short channel MISFET.

The above and other objects and novel features of the present invention will become apparent from the following description therein and accompanying drawings.

Among the inventions disclosed in the present application, typical ones will be summarized briefly as follows.

In the present invention, there are provided a semiconductor device and its manufacturing method comprising, upon formation of a MISFET having a gate length not greater than about 0.1 μm, forming a first conductivity type impurity layer having a first peak in impurity concentration distribution and another first conductivity type impurity layer having a second peak in impurity concentration distribution in a substrate; forming source and drain extension regions of a second conductivity type in the substrate after formation of a gate electrode; and forming source and drain diffusion regions of the second conductivity type in the substrate after formation of side wall spacer on the side walls of the gate electrode;

wherein the first peak exists in a region shallower than the joint depth of the source and drain diffusion regions; and the second peak exists in a region deeper than a channel region. In another aspect, the impurity concentration of the second peak is greater than that of the first peak. In a further aspect, the sum of the impurity concentrations of the channel region is $5\times10^{17}/cm^3$ or less. In a still further aspect, as an element for constituting an impurity layer of the second peak, that having a greater mass than the mass of an element constituting the impurity layer of the first peak is ion implanted.

According to the above-described means, by forming an impurity layer having a function of preventing punch-through all over the surface of the substrate below the channel region of a MISFET, fluctuations of a threshold voltage can be suppressed compared with the case where a punch-through stopper layer is formed by a pocket structure. In addition, the controllable width of a depletion layer becomes relatively large by imparting two peaks, that is, first peak and second peak, to impurity concentration distribution of the impurity layer, making it possible to decrease a sub-threshold swing. This prevents lowering of a threshold voltage and improving a switching rate of a MISFET. Moreover, since the sum of the impurity concentrations of the channel region is not greater than $5\times10^{17}/cm^3$, mobility can be heightened. As an element for constituting an impurity layer of the second peak, that having a greater mass than the mass of an element constituting the impurity layer of the first peak is ion implanted so that the surface concentration can be decreased while heightening a peak concentration, making it possible to prevent lowering of mobility. In addition, an on-state current can be improved at a drain voltage of 1V or less compared with a pocket structure. In other words, in the MISFET of the present invention, an on-state current can be improved by operation at a supply voltage of 1V or less.

DETAILED DESCRIPTION OF THE DRAWINGS

DETAILED DESCRIPTION OF THE PREFERRED EMBODIMENTS

The embodiments of the present invention will hereinafter be described in detail based on accompanying drawings. In all the drawings for explaining these embodiments, like members having the same function will be identified by like reference numerals and overlapping descriptions will be omitted.

Embodiment 1

A manufacturing method of a CMOS (complementary metal oxide semiconductor) device according to one embodiment of the present invention will be described in the order of steps based on fragmentary cross-sectional views of a substrate illustrated in FIGS. 1 to 9. In these drawings, Qn means an n channel type MISFET, while Qp means a p channel type MISFET.

Figure 1:
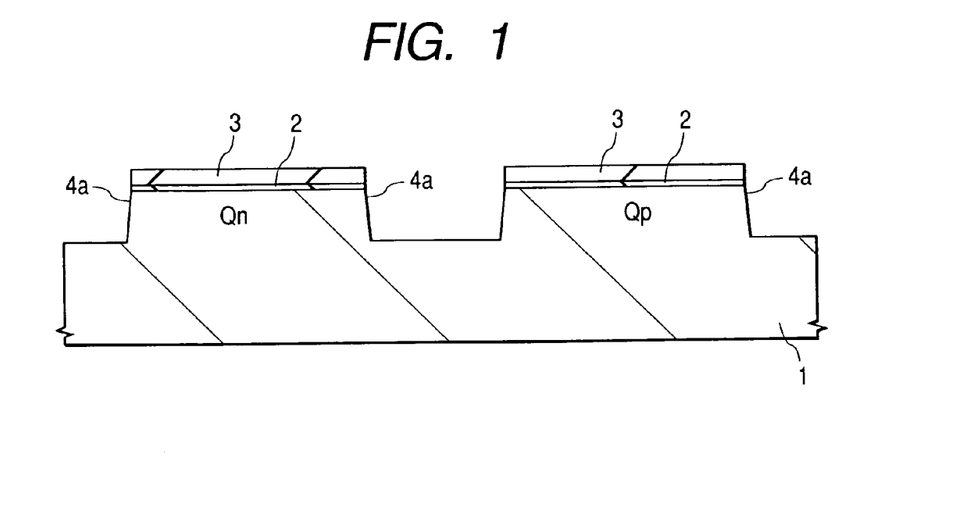
FIG. 1 is a fragmentary cross-sectional view of a substrate for illustrating a manufacturing method of a CMOS device according to one embodiment of the present invention.

First, as illustrated in FIG. 1, a substrate 1 made of p type single crystal silicon is prepared. This substrate 1 is then subjected to thermal oxidation to form a thin silicon oxide film 2 of about 0.01 μm thick over its surface. After deposition of a silicon nitride film 3 of about 0.1 μm thick thereover by CVD (chemical vapor deposition), the silicon nitride film 3, silicon oxide film 2 and substrate 1 are successively dry etched with a resist pattern as a mask, whereby an element isolating trench 4a of about 0.35 μm deep is formed in the substrate 1 of an isolation region.

Figure 2:
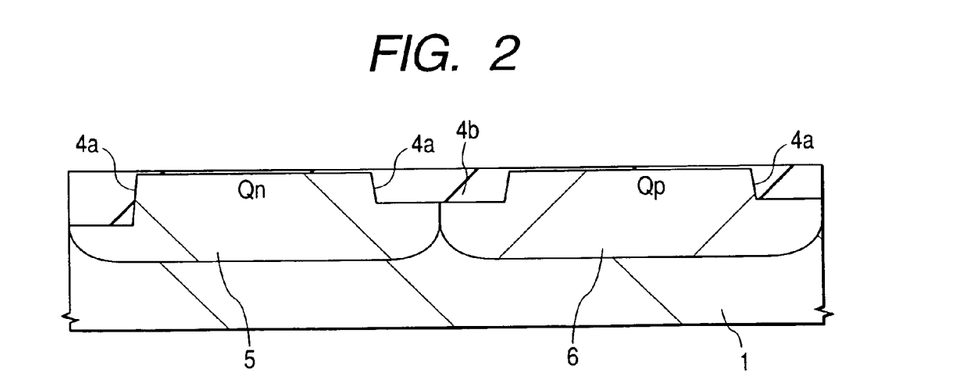
FIG. 2 is a fragmentary cross-sectional view of a substrate for illustrating a manufacturing method of a CMOS device according to the one embodiment of the present invention.

After removal of the silicon nitride film 3 by wet etching with hot phosphoric acid, the silicon oxide film 4b deposited over the substrate 1 by CVD is etched back or polished by CMP (chemical mechanical polishing) as illustrated in FIG. 2 to leave the silicon oxide film 4b inside of the element isolating trench 4a, whereby the isolation region is formed. The substrate 1 is then annealed at about 1000° C. to densify the silicon oxide film 4b embedded in the element isolating trench 4a.

Boron (B) is ion-implanted to an n-channel type MISFETQn formation region of the substrate 1 as a p type impurity for forming a p type well 5, while phosphorus (P) is ion-implanted to a p channel type MISFETQp formation region as an n type impurity for forming an n type well 6. The above-described B is implanted, for example, at an energy of 200 keV and a dose of $2 \times 10^{13}$ cm$^{-2}$, while the above-described P is implanted, for example, at an energy of 500 keV and a dose of $3 \times 10^{13}$ cm$^{-2}$.

Figure 3:
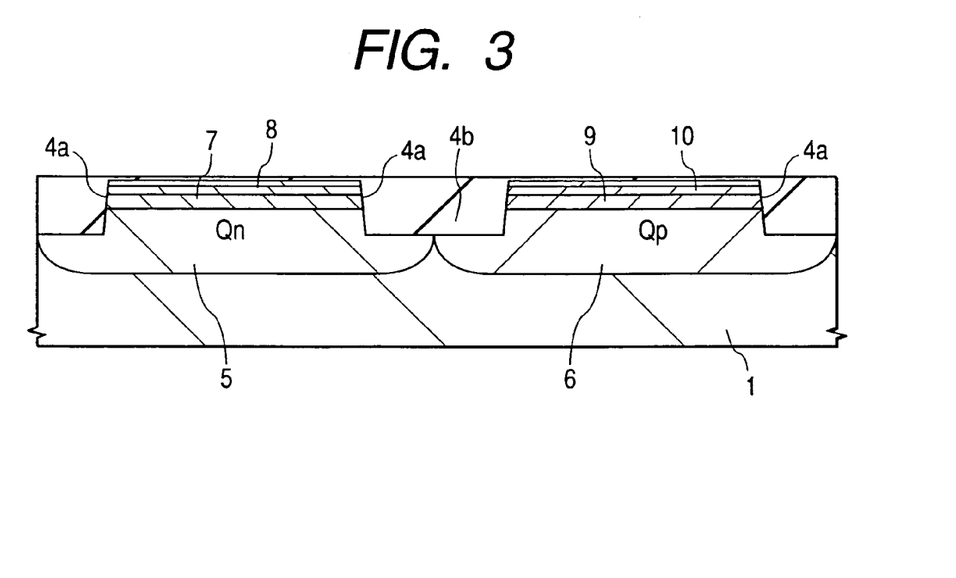
FIG. 3 is a fragmentary cross-sectional view of a substrate for illustrating a manufacturing method of a CMOS device according to the one embodiment of the present invention.

As illustrated in FIG. 3, a p type impurity such as B is ion-implanted to the n-channel MISFETQn formation region of the substrate 1 to form a p type impurity layer 7 having a first peak in impurity concentration distribution, followed by ion-implantation of a p type impurity such as indium (In), which is greater in mass than the impurity (B) constituting the p type well 5, to form a p type impurity layer 8 having a second peak in the ion concentration distribution. The depth of the first peak of the p type impurity layer 7 from the surface of the substrate 1 exists in a region relatively deeper than the depth of second peak of the p type impurity layer 8 from the surface of the substrate 1. As described later, the p type impurity layer 7 having the first peak in the impurity concentration distribution has a function of preventing punch-through between source and drain diffusion regions, while the p type impurity layer 8 having the second peak in the impurity concentration distribution has a function of preventing punch-through between the source and drain extension regions. The above-described B is implanted, for example at an energy of 30 keV and a dose of $1 \times 10^{13}$ cm$^{-2}$, while the above-described In is implanted, for example, at an energy of 160 keV and a dose of $1 \times 10^{13}$ cm$^{-2}$.

Elements having a large mass such as In has a small diffusion coefficient so that it is possible to lower the concentration on the surface of the substrate 1, while heightening the concentration of the second peak. Since the p type impurity layer 8 serves to prevent punch-through between source and drain extension regions, its impurity concentration must be set high. Implantation of an element having a small diffusion coefficient and small mass, on the other hand, increases the concentration on the surface of the substrate 1, inevitably causing a problem that the mobility of carriers drops owing to scattering of an impurity. It is therefore possible to prevent lowering in the mobility of carriers by implanting an element having a large mass, thereby decreasing the concentration on the surface of the substrate 1.

The p type impurity layer 7 serves to prevent punch-through between the source and drain diffusion regions. When this p type impurity layer 7 is formed by implanting an element having a large mass at a high energy, silicon (Si) forming the substrate 1 becomes amorphous, thereby inevitably generating crystal defects upon heat treatment after this step. The p type impurity layer 7 is contiguous to the drain region so that crystal defects, if any, generate leakage current between the drain region and the substrate 1. This problem can be solved by implanting an element having a small mass to form the p type impurity layer 7.

Similarly, an n type impurity, for example, P is ion-implanted to the p channel type MISFETQp formation region of the substrate 1 to form an n type impurity layer 9 having a first peak in the impurity concentration distribution, followed by ion-implantation of an n type impurity such as arsenic (As), which has a larger mass than the impurity (P) constituting the n type well 6, to form an n type impurity layer 10 having a second peak in the impurity concentration distribution. The depth of the first peak of the n type impurity layer 9 from the surface of the substrate 1 exists in a region relatively deeper than the depth of the second peak of the n type impurity layer 10 from the surface of the substrate 1. As described later, the n type impurity layer 9 having the first peak in the impurity concentration distribution has a function of preventing punch-through between source and drain diffusion regions, while the n type impurity layer 10 having the second peak in the impurity concentration distribution has a function of preventing punch-through between the source and drain extension regions. The above-described P is implanted, for example at an energy of 80 keV and a dose of $1 \times 10^{13}$ cm$^{-2}$, while the above-described As is implanted, for example, at an energy of 80 keV and a dose of $1 \times 10^{13}$ cm$^{-2}$.

Thus, in the p type well 5 defined by the element isolating trench 4a and silicon oxide film 4b, the p type impurity layer 8 is formed to have a second peak at a predetermined depth from the surface of the substrate 1, while the p type impurity layer 7 is formed to have a first peak at a predetermined depth from the surface of the substrate 1. Described specifically, the p type impurity layer 7 is formed to have a predetermined depth all over the regions between the source and drain diffusion regions 14b below the gate electrode 13n and at the same time, to be brought into contact with the source and drain diffusion regions 14b. The p type impurity layer 8 is, on the other hand, formed to have a predetermined depth all over the regions between the source and drain extension regions 14a below the gate electrode 13n and at the same time, to be brought in contact with the the source and drain extension regions 14a.

In the n type well 6 defined by the element isolating trench 4a and silicon oxide film 4b, the n type impurity layer 10 is formed to have a second peak at a predetermined depth from the surface of the substrate 1, while the n type impurity layer 9 is formed to have a first peak at a predetermined depth from the surface of the substrate 1. As will be described later, the n type impurity layer 9 is formed to have a predetermined depth all over the regions between the source and drain diffusion regions 15b below the gate electrode 13p and at the same time, to be contiguous to the source and drain diffusion regions 15b. The n type impurity layer 10 is formed to have a predetermined depth all over the regions between the source and drain extension regions 15a below the gate electrode 13p and at the same time, to be contiguous to the source and drain extension regions 15a.

Figure 4:
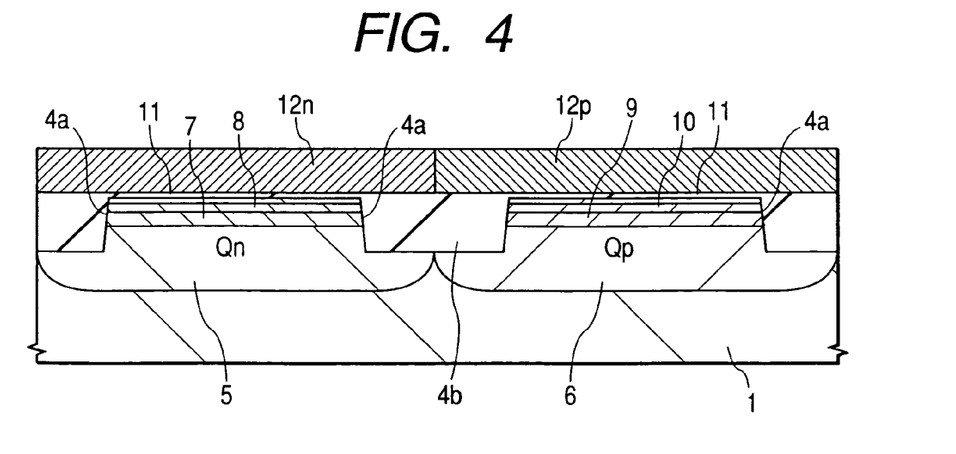
FIG. 4 is a fragmentary cross-sectional view of a substrate for illustrating a manufacturing method of a CMOS device according to the one embodiment of the present invention.

As illustrated in FIG. 4, after formation of a gate insulating film 11 of about 2 nm on the surface of each of the p type well 5 and n type well 6 by thermal oxidation of the substrate 1, an amorphous silicon film (not illustrated) of about 200 nm thick is deposited over the substrate 1 by CVD. Into the amorphous silicon film in the n channel MISFETQn formation region, an n type impurity, for example, P is ion-implanted, while a p type impurity such as B is ion-implanted into the amorphous silicon film in the p channel type MISFETQp formation region.

The resulting substrate is heat treated, for example, at 950° C. for about 60 seconds to activate the n type impurity and p type impurity introduced into the amorphous silicon film and moreover to convert the amorphous silicon films in the n channel type MISFETQn formation region and the p channel type MISFETQp formation region into an n type polycrystalline silicon film 12n and p type polycrystalline silicon film 12p, respectively.

Figure 5:
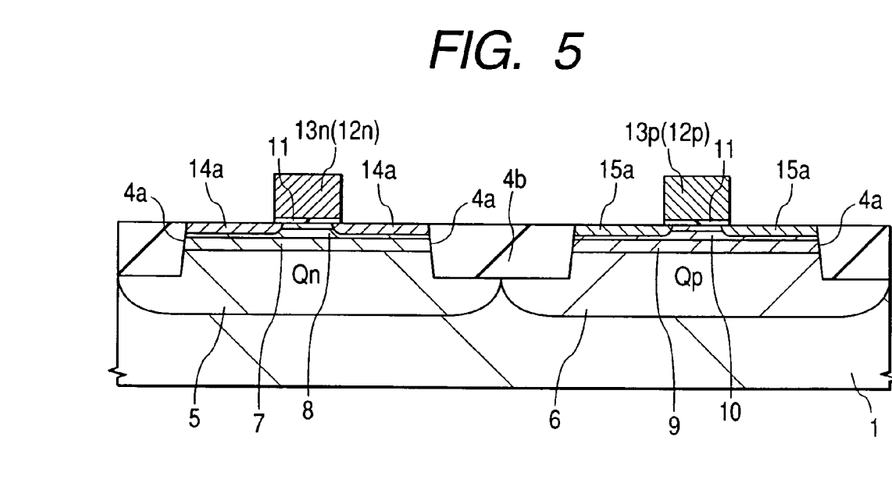
FIG. 5 is a fragmentary cross-sectional view of a substrate for illustrating a manufacturing method of a CMOS device according to the one embodiment of the present invention.

As illustrated in FIG. 5, the n type polycrystalline silicon film 12n is etched with a resist pattern as a mask to form the gate electrode 13n formed of the n type polycrystalline silicon film 12n and having a gate length of about 0.1 µm in the n channel type MISFETQn formation region. At the same time, the p type polycrystalline silicon film 12p is etched with a resist pattern as a mask to form a gate electrode 13p formed of the p type polycrystalline silicon film 12p and having a gate length of about 0.1 µm in the p channel type MISFETQp formation region. The substrate 1 is then subjected to dry oxidation treatment at 800° C.

After the n type well 6 is covered with a resist film, an n type impurity, for example, As is ion-implanted to the p type well 5 with the gate electrode 13n of the n channel type MISFETQn as a mask, whereby source and drain extension regions 14a of the n channel MISFETQn are formed. The above-described As is implanted at an energy of 5 keV and a dose of $1 \times 10^{15}$ cm$^{-2}$ and by this implantation, source and drain extension regions 14a having a joint depth of about 0.04 µm are formed.

Similarly, after the p type well 5 is covered with a resist film, a p type impurity, for example, boron fluoride (BF$_2$) is ion-implanted to the n type well 6 with the gate electrode 13p of the p channel type MISFETQp as a mask, whereby source and drain extension regions 15a of the p channel MISFETQp are formed. The above-described BF$_2$ is implanted at an energy of 3 keV and a dose of $1 \times 10^{15}$ cm$^{-2}$ and by this implantation, source and drain extension regions 15a having a joint depth of about 0.04 µm are formed.

Figure 6:
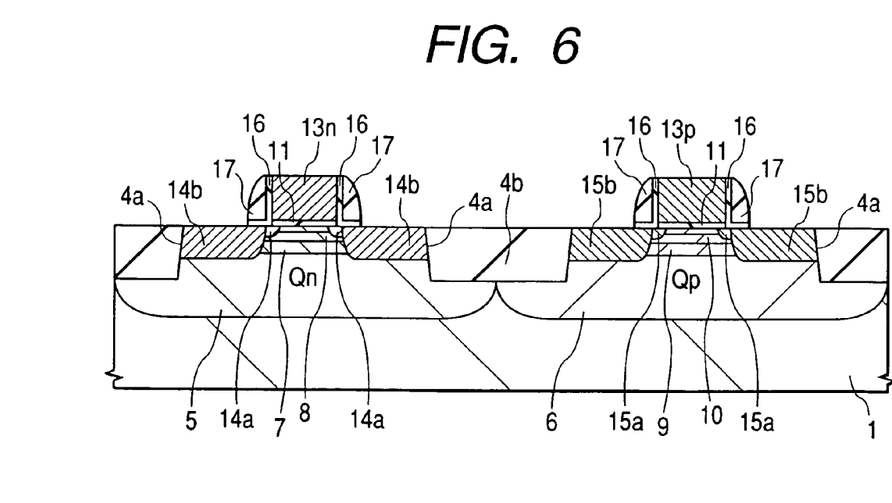
FIG. 6 is a fragmentary cross-sectional view of a substrate for illustrating a manufacturing method of a CMOS device according to the one embodiment of the present invention.

After successive deposition of a silicon nitride film 16 and a silicon oxide film 17 over the substrate 1 by CVD, the silicon oxide film 17 is subjected to anisotropic etching by RIE (reactive ion etching), followed by etching of the silicon nitride film 16, whereby side wall spacers made of the silicon nitride film 16 and silicon oxide film 17 are formed over the side walls of the gate electrode 13n of the n channel type MISFETQn and gate electrode 13p of the p channel type MISFETQp as illustrated in FIG. 6.

The n type well 6 is then covered with a resist film, followed by ion-implantation of an n type impurity such as As to the p type well 5 with the gate electrode 13n and side wall spacers of the n channel type MISFETQn as masks, whereby source and drain diffusion regions 14b whose joint depth exists in a region deeper than the first peak of the p type impurity layer 7 are formed. The above-described As is implanted, for example, at an energy of 40 keV and a dose of $2 \times 10^{15}$ cm$^{-2}$ and by this implantation, source and drain diffusion regions 14b having a joint depth of about 0.1 µm are formed.

Figure 7:
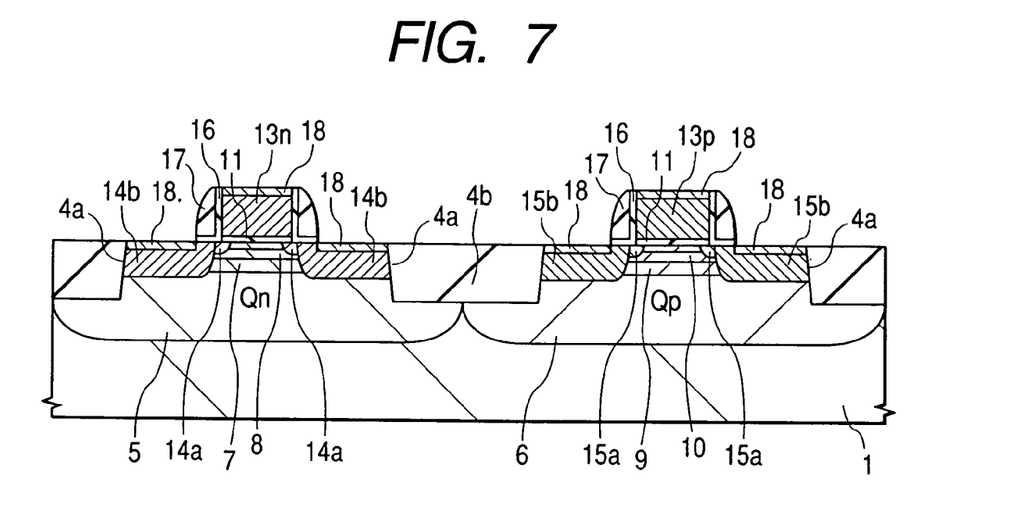
FIG. 7 is a fragmentary cross-sectional view of a substrate for illustrating a manufacturing method of a CMOS device according to the one embodiment of the present invention.

Similarly, the p type well 5 is covered with a resist film, followed by ion-implantation of a p type impurity such as BF$_2$ to the n type well 6 with the gate electrode 13p and side wall spacers of the p channel type MISFETQp as masks, whereby source and drain diffusion regions 15b whose joint depth exists in a region deeper than the first peak of the n type impurity layer 9 are formed. The above-described BF$_2$ is implanted, for example, at an energy of 25 keV and a dose of $2 \times 10^{15}$ cm$^{-2}$ and by this implantation, source and drain diffusion regions 15b having a joint depth of about 0.1 µm are formed As illustrated in FIG. 7, after washing the substrate 1 with a hydrofluoric acid (HF) solution, a cobalt (Co) film of about 10 to 20 nm thick was deposited over the substrate 1, for example, by sputtering. The substrate 1 is then heat treated at about 500 to 600° C. to selectively form a silicide layer 18 of about 30 nm thick over the surface of the gate electrode 13n of the n channel type MISFETQn, the surface of the source and drain diffusion regions 14b, the surface of the gate electrode 13p of the p channel type MISFETQp and the source and drain diffusion regions 15b. The unreacted portion of the Co film is then removed, followed by heat treatment of the substrate 1 at about 700 to 800° C. to lower the resistance of the silicide layer 18.

Figure 8:
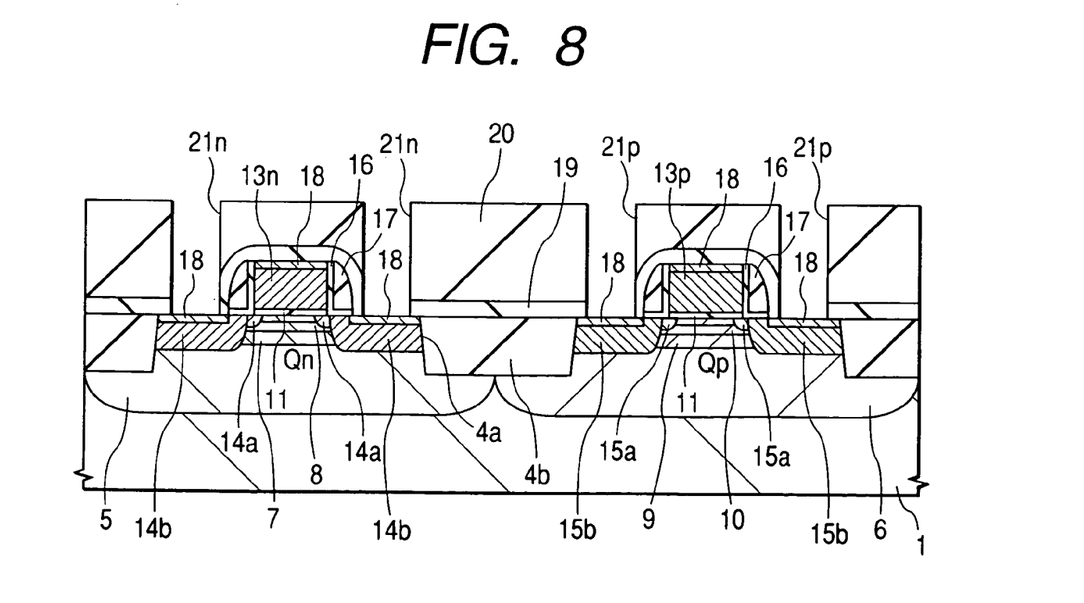
FIG. 8 is a fragmentary cross-sectional view of a substrate for illustrating a manufacturing method of a CMOS device according to the one embodiment of the present invention.

As illustrated in FIG. 8, a silicon nitride film 19 is deposited over the substrate 1 by plasma CVD and then, an interlevel insulating film 20 is formed, for example, from a silicon oxide film. With a resist pattern as a mask, the interlevel insulating film 20 and silicon nitride film 19 are etched successively to open contact holes 21n which reach the silicide layer 18 disposed over the surface of the source and drain diffusion regions 14b of the n channel type MISFETQn and contact holes 21p which reach the silicide layer 18 disposed on the surface of the source and drain diffusion regions 15b of the p channel type MISFETQp. In addition, contact holes which reach the silicide layer 18 disposed over the surfaces of the gate electrode 13n of the n channel type MISFETQn and the silicide layer 18 disposed over the surface of the gate electrode 13p of the p channel type MISFETQp, respectively are formed, which are however not illustrated.

Figure 9:
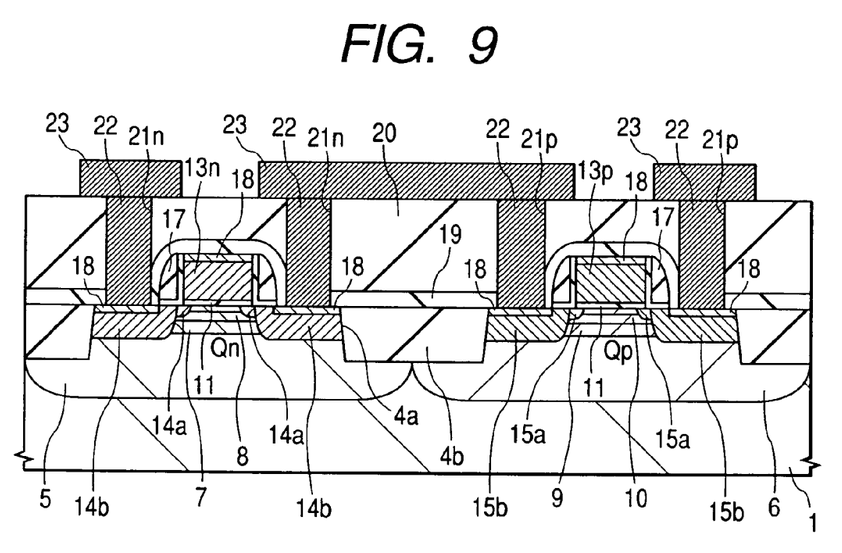
FIG. 9 is a fragmentary cross-sectional view of a substrate for illustrating a manufacturing method of a CMOS device according to the one embodiment of the present invention.

As illustrated in FIG. 9, a metal film such as tungsten (W) film is deposited over the interlevel insulating film 20. The surface of this metal film is planarized, for example, by CMP to embed the metal film inside of the contact holes 21n,21p, whereby a plug 22 is formed. By etching the metal film deposited over the interlevel insulating film 20 to form an interconnect layer 23, whereby a CMOS device is substantially completed.

Figure 10A:
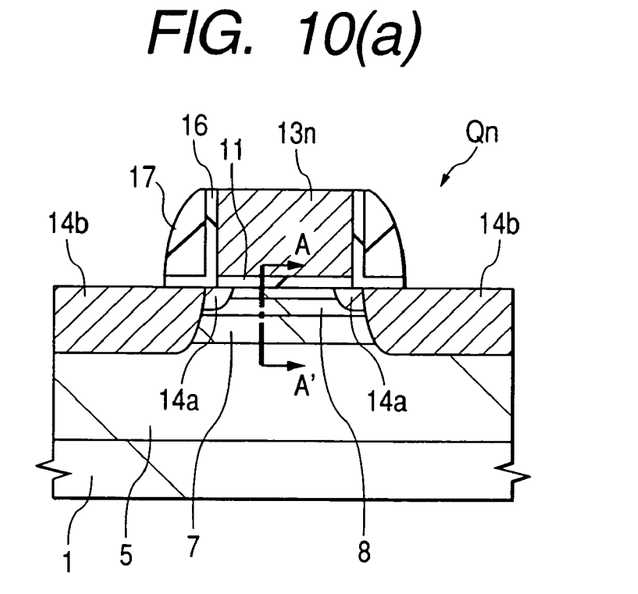
FIG. 10(a) is an enlarged cross-sectional view illustrating an n-channel type MISFET and FIG. 10(b) illustrates impurity concentration distribution taken along a line A–A' of (a)
Figure 10B:
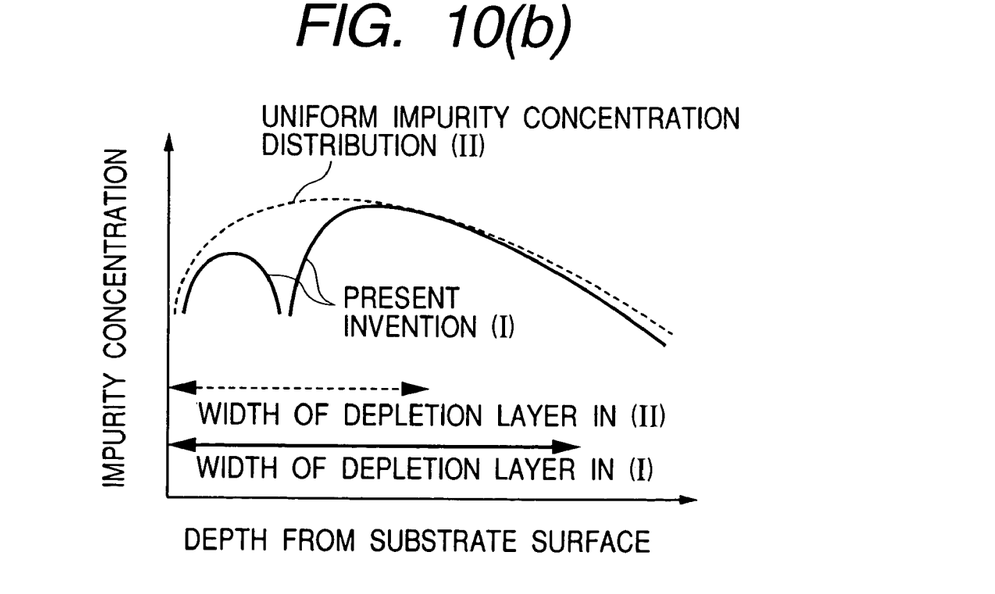
Figure 11A:
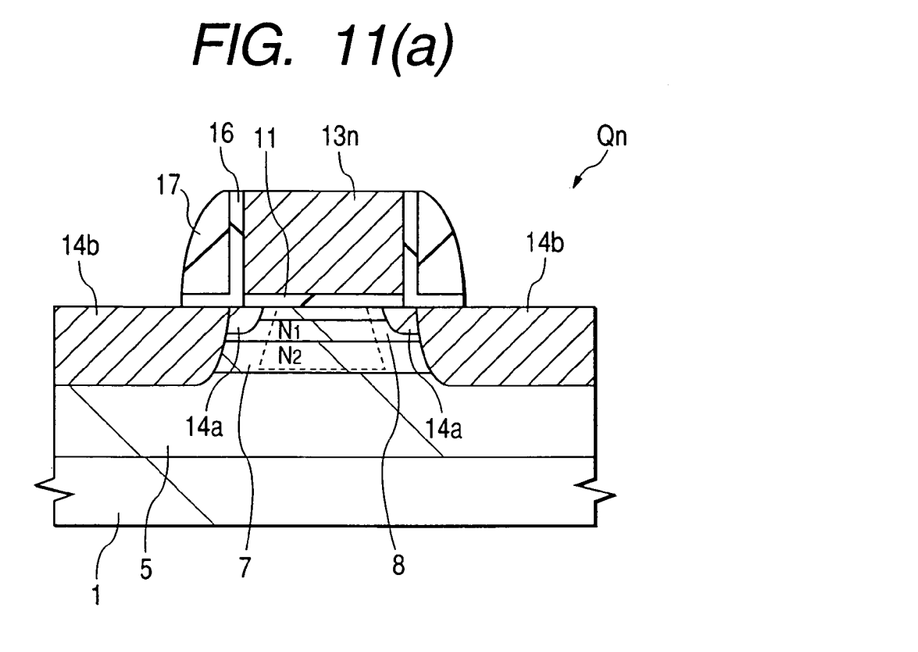
FIGS. 11(a) and 11(b) are enlarged cross-sectional views illustrating the shape of the depletion layer of the n-channel type MISFET.
Figure 11B:
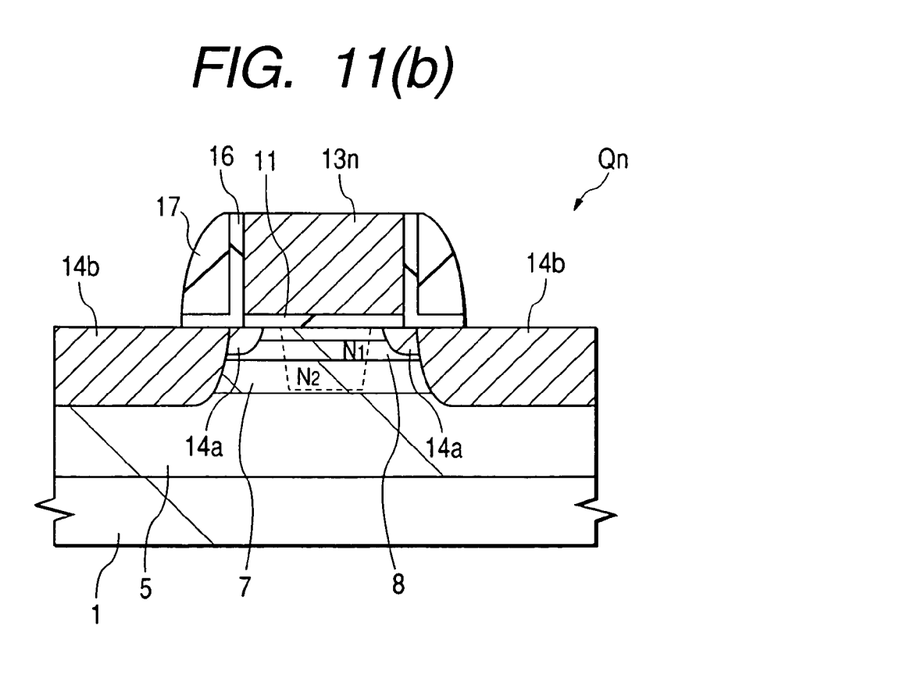
Figure 12:
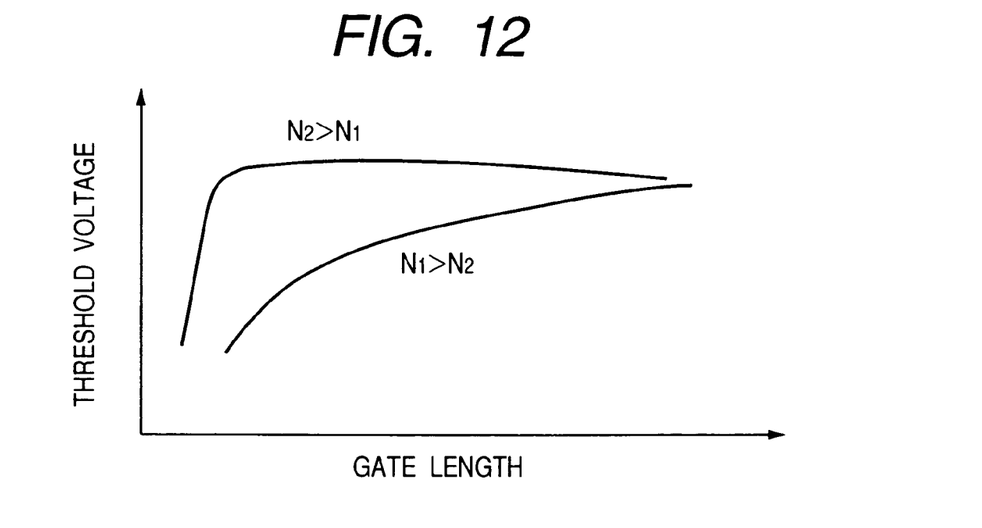
FIG. 12 is a graph illustrating dependence, on gate length, of the threshold voltage of the n-channel type MISFET.

Various characteristics of the n channel type MISFETQn will next be described based on FIGS. 10 to 12. FIG. 10(a) is an enlarged cross-sectional view illustrating the n channel type MISFETQn, and FIG. 10(b) illustrates the impurity concentration distribution taken along a line A–A' of FIG. 10(a). FIG. 11 is an enlarged cross-sectional view illustrating the shape of a depletion layer of the n channel type MISFETQn, while FIG. 12 illustrates the dependence, on gate length, of the threshold voltage of the n channel type MISFETQn. The description here is on various characteristics of the n channel type MISFETQn here, which also applies to those of the p channel type MISFETQp.

As illustrated in FIG. 10, the first peak in the impurity concentration distribution of the p type impurity layer 7 exists in a region shallower than the joint depth of the source and drain diffusion regions 14b, while the second peak in the impurity concentration distribution of the p type impurity layer 8 exists in a region deeper than the channel region and shallower than the joint depth of the source and drain diffusion regions 14b. The second peak of the p type impurity layer 8 exists in a region shallower than the first peak of the p type impurity layer 7. Described specifically, the p type impurity layer 7 is formed to have a uniform depth all over the region between the source and drain diffusion regions 14b below the gate electrode 13n and also to be brought into contact with the source and drain diffusion regions 14b. The p type impurity layer 8 is formed to have a uniform depth all over the region between the source and drain extension regions 14a below the gate electrode 13n and also to be brought into contact with the source and drain extension regions 14a. By using such a substrate 1 having impurity concentration distribution composed of two peaks, that is, first peak and second peak, the width of a controllable depletion layer becomes large compared with the substrate having a uniform impurity concentration distribution (indicated by a dotted line in the diagram) investigated by the present inventor, making it impossible to decrease a sub-threshold swing S.

The sub-threshold swing S is expressed by the following equation:

$$S = 1n10(1+Cd/Cox) \quad \text{Equation (1)}$$

$$Cd = \epsilon/d \quad \text{Equation (2)}$$

wherein, Cd means the capacity of the depletion layer to be controllable by the gate electrode 13n, Cox means the capacity of the gate insulating film 11 and d means the width of the depletion layer in the depth direction, which width can be controlled by the gate electrode 13n. Accordingly, with an increase in the width d of the depletion layer, S decreases. "S" is also defined as a gate voltage necessary for a change of electric current by one figure when sub-threshold property is plotted on a semi-log graph. With a decrease in S, an increasing ratio of electric current relative to a rise in the gate voltage becomes greater and a switching rate of MISFET heightens.

In this embodiment 1, as described above, the p type impurity layer 8 is formed by introducing In which has a large mass. This makes it possible to lower the impurity concentration on the surface of the substrate 1, whereby scattering of impurities can be prevented and mobility of carriers can be increased. By positioning the second peak in the impurity concentration distribution of the p type impurity layer 8 at about 50 nm deep from the surface of the substrate 1 and setting the concentration of this second peak at about $1 \times 10^{18}$ cm$^{-3}$ while by setting the concentration on the surface of the substrate 1 at about $5 \times 10^{17}$ cm$^{-3}$, a steep concentration gradient can be formed on the surface of the substrate 1. In this case, carriers are confined in a quantum well formed on the surface of the substrate 1 and they flow uniformly within this quantum well. Without being affected by an interface level formed on the surface of the substrate 1, the carriers can increase their mobility.

The p type impurity layer 7 having a first peak in the impurity concentration distribution serves to prevent punch-through between source and drain diffusion regions 14b, while the p type impurity layer 8 having a second peak in the impurity concentration distribution serves to prevent punch-through between source and drain extension regions 14a. Formation of the p type impurity layers 7,8 all over the surface of the substrate 1 makes it possible to prevent fluctuations in the threshold voltage due to the fluctuations of the punch-through stopper layer in the width direction compared with the formation of a punch-through stopper layer of a pocket structure.

It is preferred to set the impurity concentration of the first peak at about $1 \times 10^{18}$ cm$^{-3}$ or greater, higher than that of the second peak. By setting in this manner, the width of the depletion layer from the source and drain diffusion regions 14b at a deeper region becomes smaller than that of the depletion layer from the source and drain extension regions 14a and the shape of the depletion layer controllable by the gate electrode 13n becomes trapezoidal as illustrated in FIG. 11(a). The roll-off of the threshold voltage is relaxed in MISFET having a trapezoidal depletion layer compared with MISFET having a reversal trapezoidal depletion layer as illustrated in FIG. 11(b) so that the former one is effective for preventing short channel effects. In FIGS. 11 and 12, indicated at reference numeral N1 is the impurity concentration of the p type impurity layer 8 and N2 the impurity concentration of the p type impurity layer 7.

In this embodiment 1, the p type impurity layer 7 having a first peak in the impurity concentration distribution of the n channel type MISFETQn is constituted of B, which may be replaced with In. The n type impurity layer 9 having a first peak in the impurity concentration distribution of the p channel type MISFETQp is constituted of P, which may be replaced with As. Similar effects are available even by replacement.

An element such as In having a large mass has a small diffusion coefficient so that it is capable of lowering the concentration on the surface of the substrate 1 while heightening the concentration of the second peak. The p type impurity layer 8 serves to prevent punch-through between the source and drain extension regions 14a so that its impurity concentration must be set high. Implantation of an element having a small mass and a small diffusion coefficient, on the other hand, heightens the concentration on the surface of the substrate 1, causing a problem that the mobility of carriers becomes small owing to scattering of an impurity. Accordingly, implantation of an element of a large mass can lower the concentration on the surface of the substrate 1, making it possible to prevent a decline in the mobility of carriers.

The p type impurity layer 7, on the other hand, serves to prevent punch-through between the source and drain diffusion regions 14b. Formation of this p type impurity layer 7 by implantation of an element of a large mass at a high energy inevitably converts Si (silicon) constituting the substrate 1 to amorphous silicon, thereby generating crystal defects upon heat treatment after this step. The p type impurity layer 7 is contiguous to the drain region so that crystal defects, if generated, cause leakage current between the drain region and substrate 1. This problem can be solved by forming the p type impurity layer 7 by implantation of an element having a small mass as described above.

In this Embodiment 1, it is possible to suppress fluctuations in the threshold voltage by forming, all over the surface of the substrate 1 below the channel region of the CMOS device, impurity layers (p type impurity layers 7,8 in the case of the n channel type MISFETQn and n type impurity layer 9,10 in the case of the p channel type MISFETQp) having a function of preventing punch-through compared with the formation of a punch-stopper layer having a pocket structure. Moreover, introduction of two peaks, that is, first peak and second peak, in the impurity concentration distribution of the above-described impurity layers causes a relative increase in the controllable width of the depletion layer, thereby reducing a sub-threshold swing, which makes it possible to prevent lowering in the threshold voltage and improve the switching rate of the CMOS device.

Figure 13:
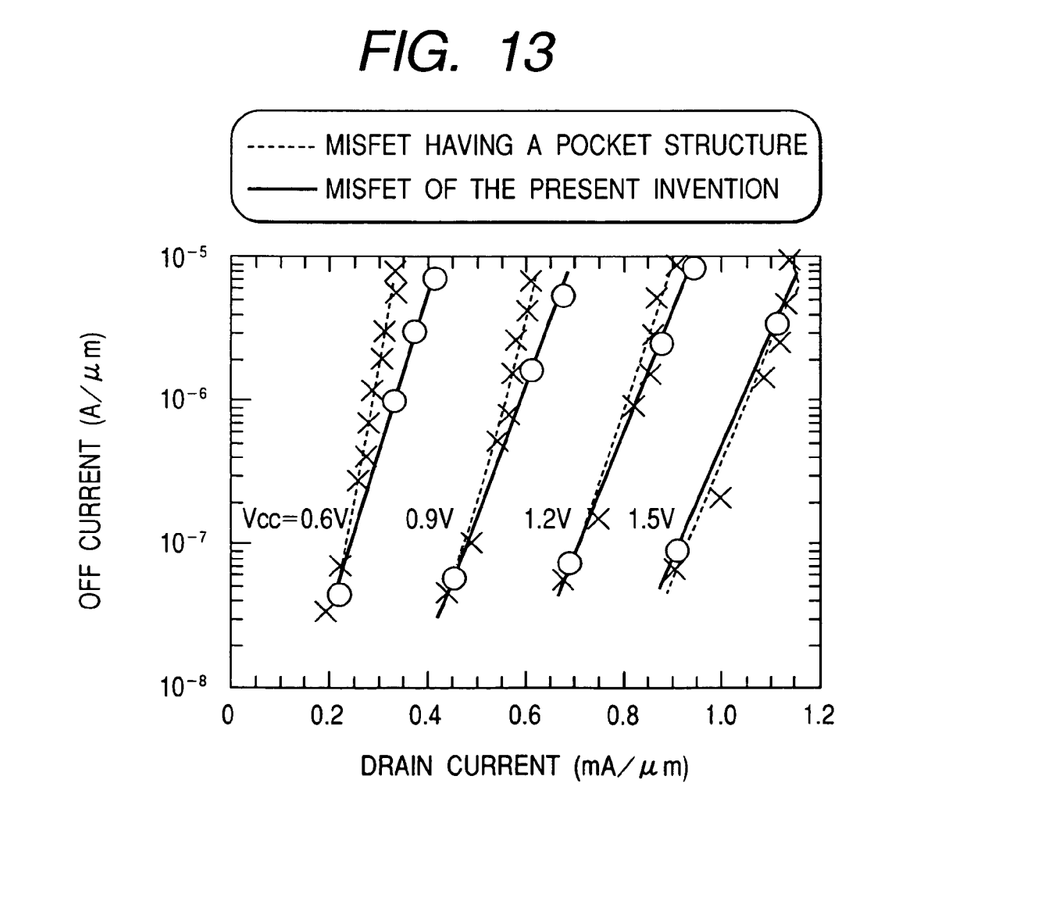
FIG. 13 illustrates relation between drain current and off-state current in MISFET which a CMOS device according to one embodiment of the present invention includes a MISFET having a pocket structure.

As illustrated in FIG. 13, the influence of an increase in mobility of carriers in the n channel type MISFETQn or p channel type MISFETQp in this Embodiment 1 appears markedly in a region of a low drain voltage in its current-voltage characteristics. In short, carriers flow at a saturated rate when the drain voltage is high. According to the test made by the present inventors to compare the MISFET formed to have a pocket structure and MISFET formed in this Embodiment, their drain currents are substantially equal or so under the conditions of the same off-state current and a drain voltage of about 1V or greater. At a drain voltage not greater than about 1V, the drain current of the MISFET formed according to this Embodiment 1 becomes greater than that of the MISRFET formed to have a pocket structure with an increase in the off-state current. In other words, since the drain current at a drain voltage not greater than about 1V can be increased in this Embodiment 1, the driving capacity of the MISFET at such a drain voltage can be improved.

Embodiment 2

Figure 14:
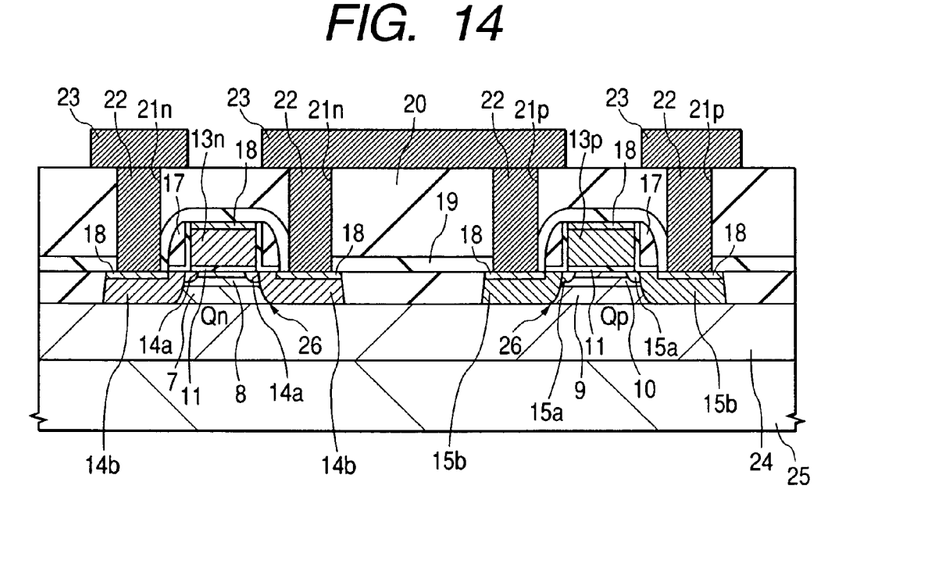
FIG. 14 is a fragmentary cross-sectional view of a substrate illustrating a CMOS device according to another embodiment of the present invention.

A CMOS device fabricated on an SOI (silicon on insulator) substrate according to another embodiment of the present invention is illustrated in FIG. 14.

In this SOI substrate, a substrate 25 is electrically separated from a device layer (silicon (S) single crystal thin film 26) by an isolating insulating film 24 and it is formed, for example, by an SIMOX (separation by implanted oxygen) technique which makes use of high energy ion implantation of oxygen or wafer laminating technique.

The CMOS device of this Embodiment 2 is formed over the above-described Si single crystal thin film 26 by a similar manufacturing method to Embodiment 1. It is possible to reduce a parasitic capacitance and improve a switching rate by forming a CMOS device on an SOI substrate as described above.

The invention made by the present inventors was so far described specifically based on the embodiments of the invention. It is needless to say that the present invention is not limited by the above-described embodiments, but can be modified within an extent not departing from the scope of the invention.

In the above-described embodiments, the p type impurity layer of the n channel type MISFET is formed of B or In, which may be replaced with another impurity showing p type conductivity. Similarly, the n type impurity layer of the p channel type MISFET is formed of P or As, which may be replaced with another impurity showing n type conductivity.

Among the inventions disclosed in the present application, typical ones will be summarized briefly as follows.

By forming an impurity layer having a function of preventing punch-through all over the surface of the substrate forming a short channel MISFET, and imparting first peak and second peak to the impurity layer, fluctuations of a threshold voltage can be suppressed, reduction of the threshold voltage is prevented, and switching rate is improved.

What is claimed is:

1. A semiconductor device having a MISFET,
   wherein a semiconductor region which has a conductivity type reverse to that of source and drain regions, is located in a semiconductor substrate below a gate electrode of the MISFET, and includes an impurity layer having a function of preventing punch through and a channel region of the MISFET formed between the gate electrode and the impurity layer,
   wherein the impurity layer has an impurity concentration distribution having a first peak in a region shallower than the depth of the source and drain region and a second peak in a region deeper than the channel region of the MISFET and shallower than the first peak such that the impurity concentration of the first peak is higher than the impurity concentration of the second peak and such that the impurity concentration of the second peak is higher than the impurity concentration of the channel region,
   wherein the source and drain regions have relatively low concentration source and drain extension regions and relatively high concentration source and drain diffusion regions,
   wherein the impurity layer includes a first impurity layer having the first peak and a second impurity layer have the second peak, wherein the first impurity layer is contiguous to a pair of the relatively high concentration source and drain diffusion regions for preventing punch through therebetween, and wherein the second impurity layer is contiguous to a pair of the relatively low concentration source and drain extension regions for preventing punch through therebetween.

2. A semiconductor device according to claim 1, wherein the sum of impurity concentrations in the channel region is $5\times10^{17}/cm^3$ or less.

3. A semiconductor device according to claim 1, wherein the MISFET functions at a supply voltage of 1V or less.

4. A semiconductor device according to claim 1, wherein the second peak has an impurity concentration of $1\times10^{18}/cm^3$ or greater and a gate length of 0.1 μm or less.

5. A semiconductor device according to claim 1, wherein the gate electrode has a gate length of about 0.1 μm or less.

6. A semiconductor device according to claim 1, wherein the first peak and the second peak are each formed by ion implantation.

7. A semiconductor device according to claim 1, wherein an impurity constituting the second peak is indium.

8. A semiconductor device having a MISFET,
wherein a semiconductor region which has a conductivity type reverse to that of source and drain regions, is located in a semiconductor substrate below a gate electrode of the MISFET, and includes an impurity layer having a function of preventing punch through and a channel region of the MISFET formed between the gate electrode and the impurity layer, wherein the impurity layer has an impurity concentration distribution having a first peak in a region shallower than the depth of the source and drain regions and a second peak in a region deeper than the channel region of the MISFET and shallower than the first peak, wherein the impurity concentration of the second peak is higher than the impurity concentration of the channel region, wherein the mass of an impurity constituting the second peak is heavier than the mass of an impurity constituting the first peak, wherein the source and drain regions have relatively low concentration source and drain extension regions and relatively high concentration source and drain diffusion regions, wherein the impurity layer includes a first impurity layer having the first peak and a second impurity layer have the second peak, wherein the first impurity layer is contiguous to a pair of the relatively high concentration source and drain diffusion regions for preventing punch through therebetween, and wherein the second impurity layer is contiguous to a pair of the relatively low concentration source and drain extension regions for preventing punch through therebetween.

9. A semiconductor device according to claim 8, wherein the MISFET functions at a supply voltage 1V or less.

10. A semiconductor device according to claim 8, wherein the second peak has an impurity concentration of $1\times1018/cm3$ or greater and a gate length of 0.1 μm or less.

11. A semiconductor device according to claim 8, wherein the gate electrode has a gate length of 0.1 μm or less.

12. A semiconductor device according to claim 8, wherein the first peak and the second peak are each formed by ion implantation.

13. A semiconductor device according to claim 8, wherein an impurity constituting the second peak is indium.

14. A semiconductor device having a MISFET,
wherein a semiconductor region which has a conductivity type reverse to that of source and drain regions, is located in a semiconductor substrate below a gate electrode of the MISFET, and includes an impurity layer having a function of preventing punch through and a channel region of the MISFET formed between the gate electrode and the impurity layer, wherein the impurity layer has an impurity concentration distribution having a first peak in a region shallower than the depth of the source and drain regions and a second peak in a region deeper than the channel region of the MISFET and shallower than the first peak such that the impurity concentration of the second peak is higher than the impurity concentration of the channel region, wherein the mass of an impurity constituting the second peak is heavier than the mass of an impurity constituting the first peak and the well region, wherein the source and drain regions have relatively low concentration source and drain extension regions and relatively high concentration source and drain diffusion regions, wherein the impurity layer includes a first impurity layer having the first peak and a second impurity layer have the second peak, wherein the first impurity layer is contiguous to a pair of the relatively high concentration source and drain diffusion regions for preventing punch through therebetween, and wherein the second impurity layer is contiguous to a pair of the relatively low concentration source and drain extension regions for preventing punch through therebetween.

15. A semiconductor device according to claim 14, wherein the sum of impurity concentrations in the channel region is $5\times10^{17}/cm^3$ or less.

16. A semiconductor device according to claim 14, wherein the MISFET functions at a supply voltage of 1V or less.

17. A semiconductor device according to claim 14, wherein the second peak has an impurity concentration of $1\times1018/cm3$ or greater and a gate length of 0.1 μm or less.

18. A semiconductor device according to claim 14 wherein the gate electrode has a gate length of 0.1 μm or less.

19. A semiconductor device according to claim 14 wherein the first peak and the second peak are each formed by ion implantation.

20. A semiconductor device according to claim 14, wherein an impurity constituting the second peak is indium.

21. A semiconductor device having a MISFET,
wherein a semiconductor region which has a conductivity type reverse to that of source and drain regions, is located in a semiconductor substrate below a gate electrode of the MISFET, and includes an impurity layer having a function of preventing punch through and a channel region of the MISFET formed between the ate electrode and the impurity layer, wherein the impurity layer has an impurity concentration distribution having a first peak in a region shallower than the depth of the source and drain regions and a second peak in a region deeper than the channel region of the MISFET and shallower than the first peak, wherein the impurity concentration of the second peak is higher than the impurity concentration of the channel region, wherein the source and drain regions have relatively low concentration source and drain extension regions and relatively high concentration source and drain diffusion regions, wherein the impurity layer includes a first impurity layer having the first peak and a second impurity layer having the second peak, wherein the first impurity layer is contiguous to a pair of the relatively high concentration source and drain diffusion regions for preventing punch through therebetween, and wherein the second impurity layer is contiguous to a pair of the relatively low concentration source and drain extension regions for preventing punch through therebetween.

22. A semiconductor device according to claim 21, wherein the MISFET functions at a supply voltage of 1V or less.

23. A semiconductor device according to claim 21, wherein the second peak has an impurity concentration of $1\times1018/cm3$ or greater and a gate length of 0.1 μm or less.

24. A semiconductor device according to claim 21, wherein the gate electrode has a gate length of 0.1 μm or less.

25. A semiconductor device according to claim 21, wherein the first peak and the second peak are each formed by ion implantation.

26. A semiconductor device according to claim 21, wherein an impurity constituting the second peak is indium.

27. A semiconductor device according to claim 21, wherein the sum of impurity concentrations in the channel formation region is $5\times1017/cm3$ or less.

28. A semiconductor device according to claim 23, wherein the sum of impurity concentrations in the channel region is $5\times1017/cm3$ or less.

* * * * *